(12) United States Patent
Kim et al.

(10) Patent No.: US 7,767,481 B2
(45) Date of Patent: Aug. 3, 2010

(54) IMAGE SENSOR AND METHOD FOR MANUFACTURING THE SAME

(75) Inventors: Sang Chul Kim, Busan (KR); Jae Won Han, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 605 days.

(21) Appl. No.: 11/646,701

(22) Filed: Dec. 27, 2006

(65) Prior Publication Data

US 2007/0145505 A1 Jun. 28, 2007

(30) Foreign Application Priority Data

Dec. 28, 2005 (KR) ........................ 10-2005-0132335

(51) Int. Cl.
*H01L 21/00* (2006.01)
(52) U.S. Cl. .................. 438/48; 438/36; 257/E21.163; 257/E21.252
(58) Field of Classification Search .................. 438/48, 438/36, 570; 257/40, 59, 292, 438, 462, 257/E21.163, E21.252
See application file for complete search history.

(56) References Cited

U.S. PATENT DOCUMENTS

| | | | |
|---|---|---|---|
| 6,096,629 A | * | 8/2000 | Tsai et al. ................. 438/570 |
| 6,329,679 B1 | | 12/2001 | Park |
| 6,583,438 B1 | * | 6/2003 | Uchida ........................ 257/59 |
| 6,989,286 B2 | * | 1/2006 | Hamilton et al. .............. 438/36 |
| 2005/0280111 A1 | * | 12/2005 | Lim ........................... 257/462 |

FOREIGN PATENT DOCUMENTS

KR 20000003407 B1 1/2000

OTHER PUBLICATIONS

Sang Hun Park; "Photodiode of Image Sensor"; Korean Patent Abstracts; Publication No. 1020000003407 A; Publication Date: Jan. 15, 2000; Korean Intellectual Property Office, Republic of Korea.
Korean Office Action dated Jan. 30, 2007; Korean Patent Application No. 10-2005-0132335; Korean Intellectual Property Office, Republic of Korea.

* cited by examiner

*Primary Examiner*—Alexander G Ghyka
*Assistant Examiner*—Abdulfattah Mustapha
(74) *Attorney, Agent, or Firm*—The Law Offices of Andrew D. Fortney; Andrew D. Fortney

(57) ABSTRACT

Disclosed are an image sensor and a method for manufacturing the same, capable of increasing a light absorbing coefficient by forming a rough surface on a photodiode. The image sensor includes a semiconductor substrate with a plurality of photodiodes thereon having rough upper surfaces, a dielectric layer on the semiconductor substrate, a color filter layer on the dielectric layer, a planarization layer on an entire surface of the semiconductor substrate including the color filter layer, and a plurality of micro-lenses formed on the planarization layer to correspond to the color filter layer.

14 Claims, 5 Drawing Sheets

IMAGE SENSOR AND METHOD FOR MANUFACTURING THE SAME

BACKGROUND OF THE INVENTION

1. Field of the Invention

The present invention relates to an image sensor. More particularly, the present invention relates to an image sensor and a method for manufacturing the same, capable of improving the sensitivity of a photodiode by making a rough surface on the photodiode such that the light absorption coefficient of the photodiode can be enhanced and light reflected from the photodiode can be prevented from being discharged through an upper layer.

2. Description of the Related Art

In general, image sensors are semiconductor devices for converting optical images into electric signals, and are generally classified into a charge coupled device (CCD) image sensor and a complementary metal oxide semiconductor (CMOS) image sensor.

The CMOS image sensor includes aphotodiode for detecting irradiated light and a logic circuit for converting detected light into electric signals which can be processed (e.g., as data). As the quantity of light received in the photodiode increases, the photosensitivity of the image sensor is improved.

To improve the photosensitivity, either a fill factor, which is a ratio of a photodiode area to the whole area of the image sensor pixel, must be increased, or a photo-gathering technology is used to change the path of light incident onto an area excluding the photodiode area such that the light can be gathered in the photodiode.

A representative example of the photo-gathering technology is to make a micro-lens. In other words, a convex micro-lens is formed over the photodiode using a material having good light transmittance characteristics, thereby refracting the path of incident light in such a manner that a greater amount of light can be transmitted into the photo-diode area than in the absence of the microlens.

In this case, light parallel to an optical axis of the micro-lens is refracted by the micro-lens so that the light is focused on a certain position of the optical axis.

Meanwhile, a typical image sensor includes a photodiode, an inter-layer dielectric layer, a color filter, and a microlens.

The photodiode detects light and converts the detected light into electrical signals. The inter-layer dielectric layer insulates adjacent metal interconnections from each other. The color filter filters white light to one of three primary colors (e.g., red, green or blue [RGB], or alternatively, yellow, cyan or magenta [YCM]). The micro-lens condenses light on the photodiode.

Hereinafter, a conventional image sensor and a method for manufacturing the same will be described in detail with reference to accompanying drawings.

FIG. 1 is a schematic view showing the conventional image sensor. FIGS. 2A to 2C are sectional views showing the method for manufacturing the conventional image sensor. FIG. 3 is a view showing the path of light passing through a micro lens in order to explain problems of the conventional technology.

As shown in FIG. 1, an inter-layer dielectric layer 20 is formed on a semiconductor substrate 10 formed with a plurality of photodiodes 40, and an RGB color filter layer 30 is formed on the inter-layer dielectric layer 20 such that the RGB color filter layer 30 corresponds to the photodiodes 40.

In addition, a planarization layer 25 is formed on the color filter layer 30 in order to planarize an irregular surface of the color filter layer 30, and microlenses 50 are formed on the planarization layer 25 such that the microlenses 50 correspond to the photodiodes 40 and the color filter layer 30.

In this case, the microlenses 50 are patterned and formed in the shape of convex lenses in order to condense light on the photodiodes. To this end, a photolithography process is employed.

In detail, as shown in FIG. 2A, after coating photoresist 60, which is a material for the micro-lens, on the planarization layer 25, the resultant structure is covered with a mask 61, and then an exposure process is performed using a defocus phenomenon, thereby patterning the photoresist 60 in the shape of a trapezoid after development, as shown in FIG. 2B.

Thereafter, as shown in FIG. 2C, the trapezoidal photoresist pattern is heated to the melting point to reflow. When the reflow process is performed, the photoresist pattern is rounded with flexibility, thereby completely forming the micro lenses 50.

Accordingly, when light is emitted from a predetermined object 70, the light incident on the image sensor through the micro-lens 50 is refracted and focused on the photodiode 40 as shown in FIG. 3.

However, the conventional photodiode does not absorb all of the light, but reflects some of the light. The reflected light may degrade the sensitivity of an image sensor.

SUMMARY OF THE INVENTION

The present invention has been made to solve the above problem(s), and therefore, it is an object of the present invention to provide an image sensor and a method for manufacturing the same, capable of improving the sensitivity of the image sensor by irregularly forming the surface of a photodiode so as to induce diffused reflection and enhance light absorption.

In order to accomplish this object of the present invention, there is provided an image sensor including a semiconductor substrate with a plurality of photodiodes each having a rough upper surface, a dielectric layer on the semiconductor substrate, a color filter layer on the dielectric layer, a planarization layer on the semiconductor substrate including the color filter layer, and a plurality of micro-lenses on the planarization layer. When the color filter layer includes a plurality of color filters, the micro-lenses may correspond to the color filters in the color filter layer.

According to another aspect of the present invention, there is provided a method for manufacturing an image sensor, the method including the steps of forming a plurality of photodiodes on a semiconductor substrate, etching a surface of the photodiodes to roughen the surface of the photodiodes, forming a dielectric layer on an entire surface of the semiconductor substrate including the photodiode, forming a color filter layer on the dielectric layer, forming a planarization layer on the semiconductor substrate including the color filter layer, and forming a micro-lens on the planarization layer.

The sensitivity improvement of an image sensor is the most important target to be achieved. In order to improve the sensitivity of the image sensor, although the thickness of an insulating layer and a micro-lens are important variables, a light absorption coefficient of the photodiode for detecting light should also be considered. In this case, the light absorption coefficient relates to the amount of absorbed light in the incident light. As a result, the reflection of light is minimized, and the absorption of light is maximized, so that the sensitivity of the image sensor can be improved even when the thicknesses of the insulating layer and the micro-lens are the same. Thus, the photodiodes generally have a surface roughness sufficient to increase a light absorption coefficient of the photodiodes relative to otherwise identical photodiodes having an unroughened surface.

To this end, according to the present invention, a sputter etching process is performed with respect to the surface of the photodiodes so as to obtain a rough surface thereon, thereby improving the light absorption coefficient of the photodiodes. Accordingly, a surface area capable of absorbing light is increased, and reflected light may be absorbed after its reflection, thereby improving the sensitivity of the photodiode as compared with that of a conventional photodiode having a relatively planar surface.

Therefore, the light absorption coefficient of the photodiode is enhanced, so the quality of an image sensor product can be improved.

DETAILED DESCRIPTION OF THE INVENTION

Hereinafter, an image sensor and a method for manufacturing the image sensor according to the present invention will be described with reference to accompanying drawings.

Figure 1:
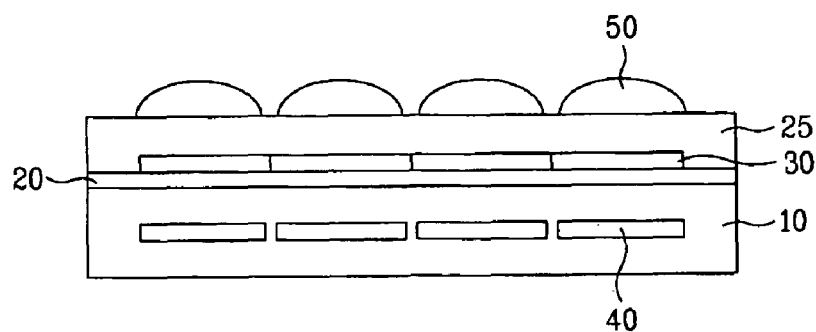
FIG. 1 is a schematic view showing a conventional image sensor.
Figure 2A:
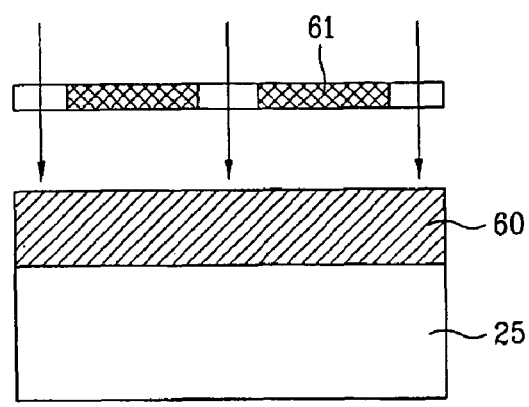
FIGS. 2A to 2c are sectional views showing a method for forming a conventional image sensor.
Figure 2B:
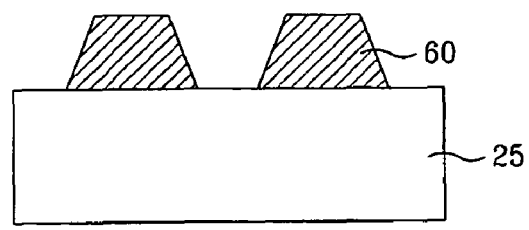
Figure 2C:
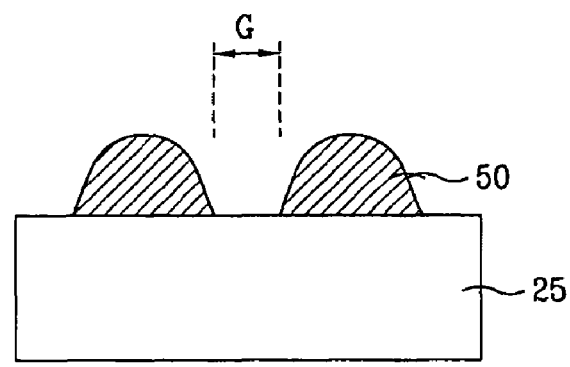
Figure 3:
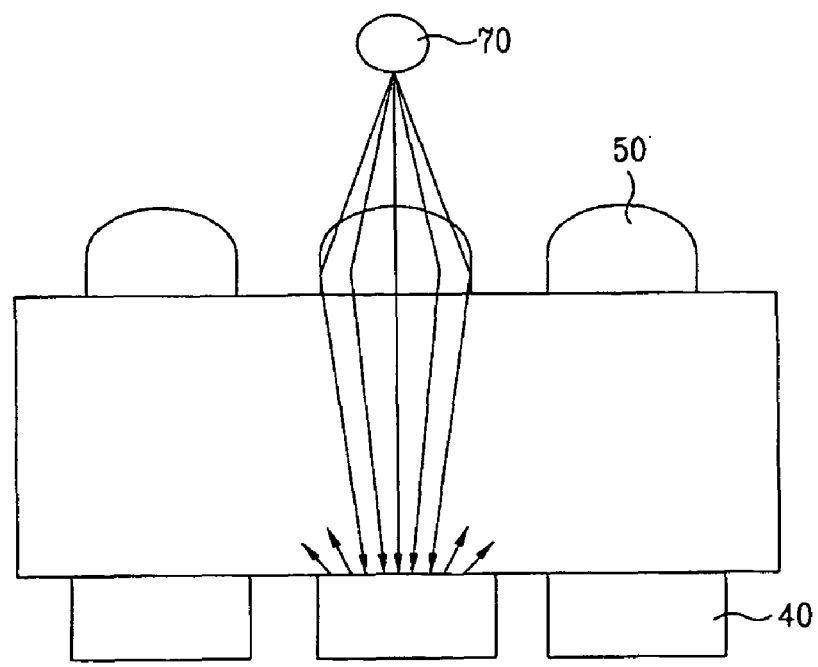
FIG. 3 is a view showing the path of light passing through a micro-lens in order to explain problems of the conventional technology.
Figure 4:
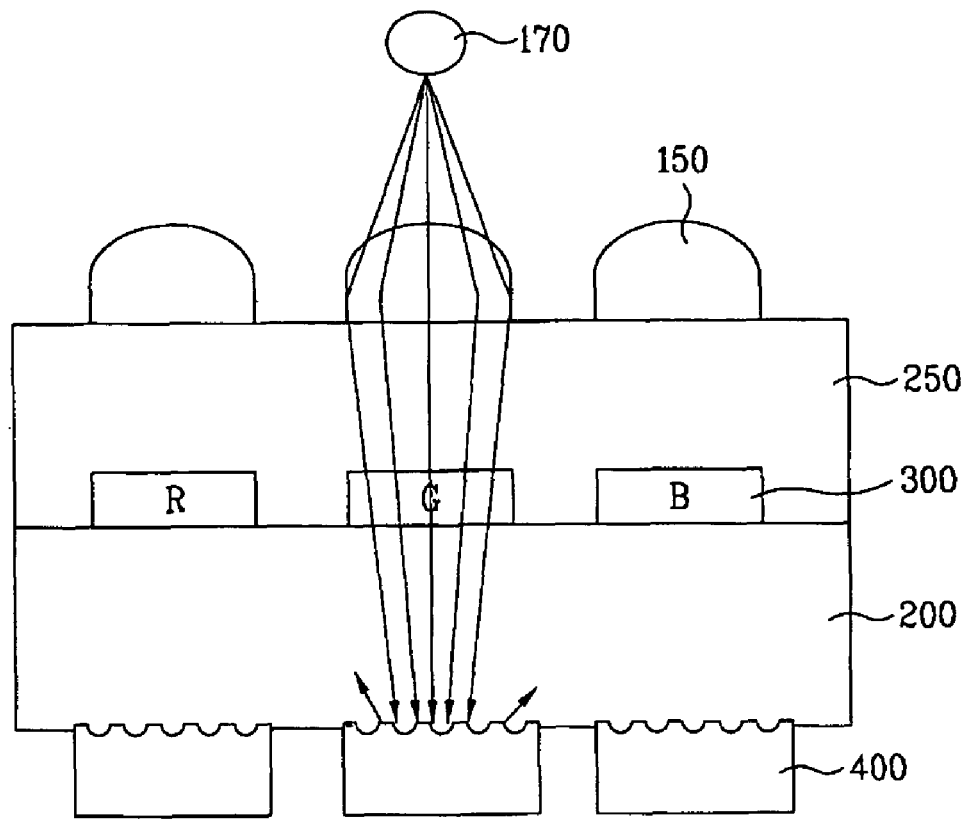
FIG. 4 is a schematic view showing an image sensor according to the present invention.
Figure 5:
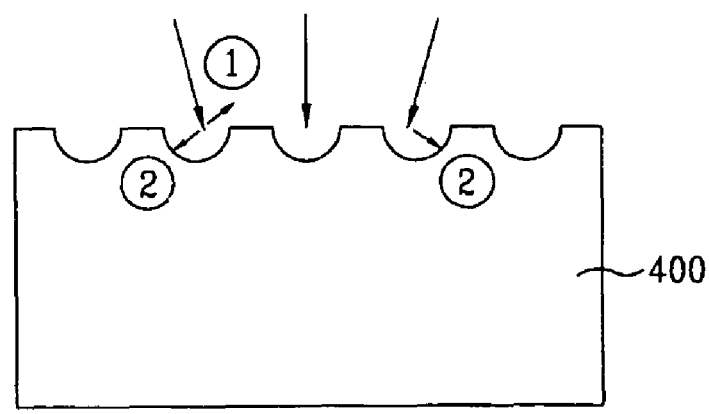
FIG. 5 is a view showing the path of light in a photodiode according to the present invention.
Figure 6A:
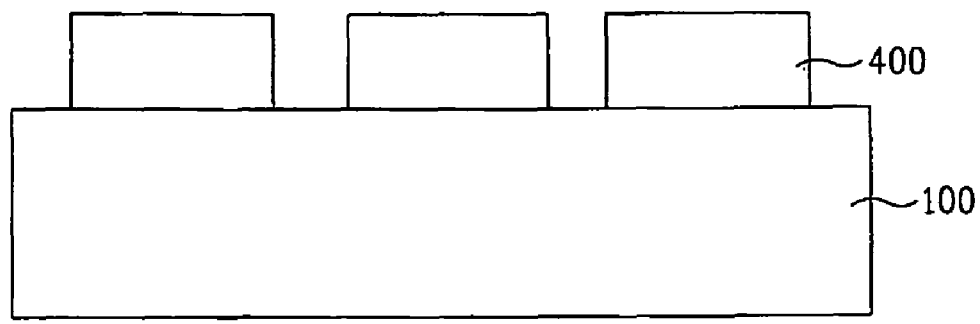
FIGS. 6A to 6C are sectional views showing a method for forming an image sensor according to the present invention.
Figure 6B:
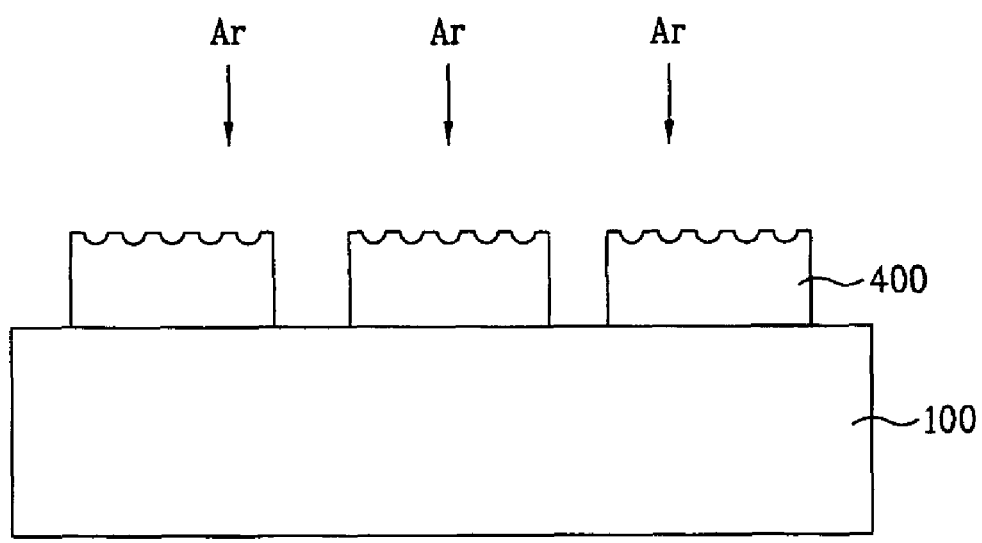
Figure 6C:
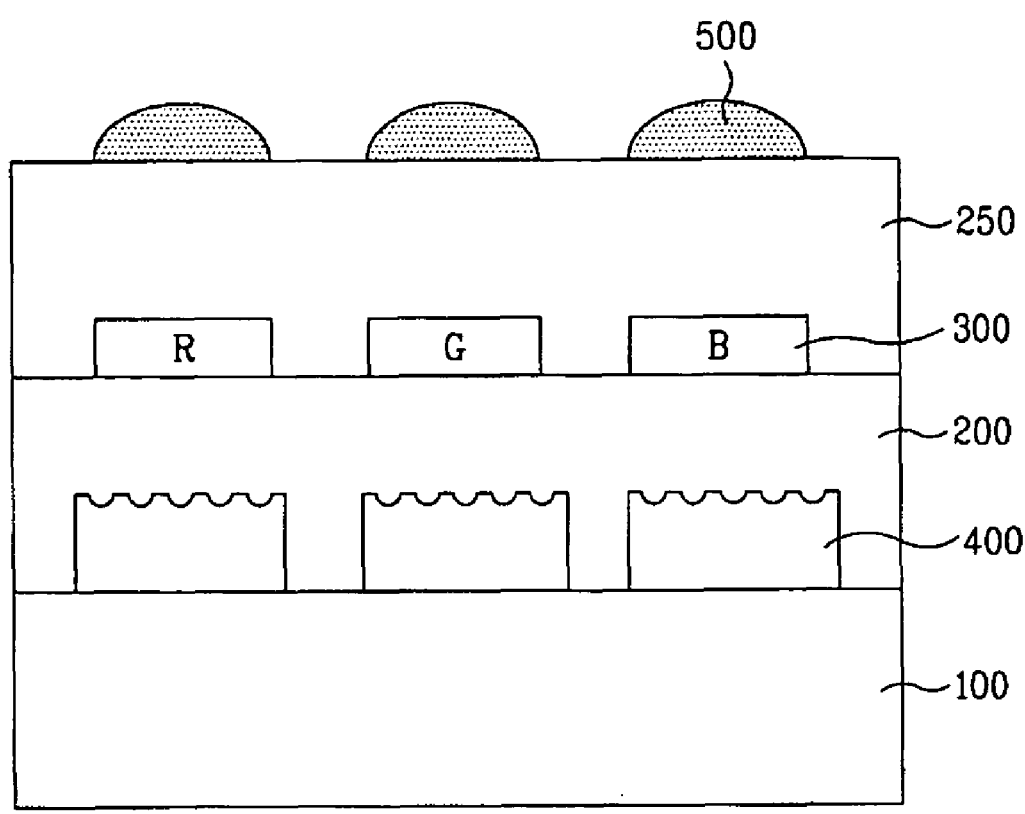

FIG. 4 is a view showing an image sensor according to the present invention. FIG. 5 is a view showing the path of light in a photodiode according to the present invention. FIGS. 6A to 6C are sectional views showing a method for forming an image sensor according to the present invention.

As shown in FIG. 4, an image sensor according to the present invention includes a plurality of photodiodes 400, and each of the photodiodes 400 has a rough surface. In order to make the surface of the photodiode rough, a sputter etching process may be performed.

A dielectric layer 200 (e.g., an inter-layer dielectric) is formed on a semiconductor substrate 100 including the photodiodes 400, and a color filter layer 300 is formed on the dielectric layer 200 such that the color filter layer 300 corresponds to the photodiodes 400. The color filter layer comprises alternatively arranged color filters in a matrix pattern of R (Red), G (Green), and B (Blue). Alternatively, the color filter matrix may include yellow (Y), cyan (C) and magenta (M) color filters.

Then, an oxide layer or a nitride layer is deposited on the entire surface of the semiconductor substrate 100 including the color filter layer, thereby forming a planarization layer 250 for providing a planar surface over the semiconductor substrate 100. The planarization layer may be formed over the entire substrate, or it may be patterned so that it is located over photoactive areas of the image sensor, and not over peripheral areas (e.g., containing peripheral structures such as bond pads, input/output circuitry, etc.).

Then, microlenses 500 having a predetermined pattern are formed on the planarization layer 250 such that the microlenses 500 correspond to the photodiodes 400 and the color filters in the color filter layer 300 (e.g., in 1:1 relationships).

In this case, when light emitted from a predetermined object 170 passes through the micro-lens 500 and the color filter layer 300, the light is focused on the photodiode 300.

The sensitivity of the photodiode may be improved by changing a focal length of the micro lens 500 through the adjustment of the thicknesses of the dielectric layer 200 and/or the planarization layer 250, or by making the surface of the photodiode 400 rough according to the present invention.

In detail, as shown in FIG. 5, if the surface of the photodiode 400 is made rough, since the surface area of the photodiode 400 capable of absorbing light is increased and/or made uneven, the light absorption coefficient of the photodiode can be improved. In other words, since light reflected from the surface of the photodiode 400 (see, reference numeral ①) is re-absorbed (see, reference numeral ②) into the surface of the photodiode 400, the sensitivity of the photodiode 400 can be improved as compared with that of the conventional photodiode having a relatively planar (e.g., unroughened) surface.

Hereinafter, a method for manufacturing such an image sensor will be described in detail.

As shown in FIG. 6A, a silicon layer is formed on the semiconductor substrate 100, and is patterned through a photolithography process, thereby forming the R, G, B-photodiodes 400 detecting red (R), green (G), and blue (B) signals in a photodiode area. In this case, the silicon layer may be formed through an epitaxial growth scheme. Alternatively, such an epitaxial silicon layer or the (single-crystal silicon) substrate 100 may have a patterned photoresist formed thereon, and the photodiodes 400 can be formed by ion implantation, as is known in the art, without further patterning of the silicon.

Then, in order to make the surface of the photodiode 400 rough as shown in FIG. 6B, a sputter etching process is performed. In this case, the semiconductor substrate formed with the photodiode 400 is loaded into a sputter etcher, and appropriate conditions are set in such a manner that the surface of the photodiode is irregularly formed. In the case where the photodiodes 400 are formed by ion implantation and without further patterning of the silicon, the sputter etching can be performed with the photoresist present or absent. Sputter etching in the presence of the photoresist may be preferred if other structures (such as transistor gates) are present in or on the epitaxial silicon layer or the (single-crystal silicon) substrate 100.

In detail, the sputter etcher includes a processor chamber, a gas supplying part provided above the sputter etcher so as to supply inert gases, such as argon (Ar) and optionally oxygen ($O_2$), into the processor chamber, a gas discharging part provided below the sputter etcher so as to discharge gases created during or after the etching process to an exterior location (e.g., a vacuum pump) while controlling the pressure in a chamber through action of the pump, and a stage (e.g., an electrostatic and/or vacuum chuck) equipped with a heating line used for heating the semiconductor substrate to a predetermined temperature while supporting the semiconductor substrate.

The sputter etching process according to the present invention may be performed for 10 to 60 seconds, using argon (Ar) or other noble gas (e.g., He, Ne, Kr), at a temperature of from 10 to 40° C. (e.g., 25° C., 30° C., or any temperature therebetween), a power of 100 to 1000 W (e.g., 200 W to 500 W), and a pressure of 0.1 to 100 mTorr (e.g., 2 mTorr to 10 mTorr).

Then, as shown in FIG. 6C, the dielectric layer 200 is formed on the semiconductor substrate 100 with a plurality of photodiodes 400 thereon, and then the color filter layer 300 is formed on the dielectric layer 200. In this case, the color filter layer 300 comprises a mosaic of color filters such that the color filter layer 300 may correspond to an RGB-photodiode in view of a color (e.g., each color filter 300 corresponds to a single photodiode 400).

Then, an oxide layer and/or a nitride layer are (selectively) deposited on the entire surface of the semiconductor substrate including the color filter layer 300. Such oxide and/or nitride layer(s) may be planarized (e.g., by chemical mechanical polishing) and/or patterned (as discussed herein), thereby forming the planarization layer 250 to planarize the surface above the semiconductor substrate.

The planarization layer 250 also serves as a guide or platform such that the micro-lens can be uniformly formed, and the thickness of the micro-lens can be adjusted according to the thickness of the planarization layer 250 such that a predetermined focal length of the micro-lens can be variously realized.

Then, a plurality of micro-lenses 500 are formed on the planarization layer 250 such that the micro-lenses 500 correspond to the color filter layer 300.

In this case, the micro lenses 500 may be patterned and formed in the shape of a convex lens in order to condense light on the photodiodes. To this end, photolithography and reflow processes are employed as discussed herein.

In detail, after coating photoresist, which is a material for the micro-lens, on the planarization layer 250, the resultant structure is covered with a mask, and then an exposure process is performed using a defocus phenomenon, and the photoresist layer is developed, thereby patterning the photoresist in the shape of a trapezoid.

Thereafter, the trapezoidal photoresist pattern is heated to the melting point to reflow. When the reflow process is performed, the photoresist pattern is rounded with flexibility, thereby completely forming the micro lenses 500.

The image sensor and the method for manufacturing the same according to the present invention have following effects.

A roughening (e.g., sputter etching) process is performed with respect to the surface of the photodiode so as to provide the photodiodes with a rough surface, so that it is possible to improve a light absorption coefficient of the photodiodes. In addition, the surface area of the photodiode may be increased and/or made uneven, so that reflected light may be absorbed, enabling improvement in the sensitivity of the photodiode as compared with the sensitivity of the conventional photodiode having a relatively planar surface.

As a result, the light absorption efficient of the photodiode is improved, so it is possible to improve the quality of an image sensor.

In addition, since the light absorption coefficient of a photodiode can be improved through a sputter etching process, it is possible to improve the sensitivity of an image sensor using a relatively simple process.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for manufacturing an image sensor, the method comprising the steps of:
   etching a surface of a plurality of photodiodes on a semiconductor substrate to roughen the photodiode surfaces;
   depositing a dielectric layer on an entire surface of the semiconductor substrate including the photodiodes having roughened surfaces;
   forming a color filter layer on the dielectric layer;
   forming a planarization layer on the semiconductor substrate including the color filter layer; and
   forming a micro-lens on the planarization layer.

2. The method as claimed in claim 1, further comprising forming the plurality of photodiodes in the semiconductor substrate.

3. The method as claimed in claim 2, wherein forming the plurality of photodiodes comprises forming and patterning a silicon layer on the semiconductor substrate.

4. The method as claimed in claim 1, wherein the step of etching the surface of the photodiodes comprises a sputter etching process.

5. The method as claimed in claim 4, wherein the sputter etching process is performed under conditions effective to provide the photodiodes with a surface roughness sufficient to increase a light absorption coefficient of the photodiodes relative to otherwise identical photodiodes having an unroughened surface.

6. The method as claimed in claim 4, wherein the sputter etching process is performed for 10 to 60 seconds.

7. The method as claimed in claim 6, wherein the sputter etching process uses argon (Ar) gas at a temperature of from 10 to 40° C.

8. The method as claimed in claim 4, wherein the sputter etching process is performed at a temperature of from 10 to 40° C.

9. The method as claimed in claim 4, wherein the sputter etching process is performed at a power of 100 W to 1000 W.

10. The method as claimed in claim 4, wherein the sputter etching process is performed at a pressure of 0.1 mTorr to 50 mTorr.

11. The method as claimed in claim 4, wherein the sputter etching process is performed using argon (Ar) gas at a temperature of 25 to 30° C., a power of 200 W to 500 W, and a pressure of 2 mTorr to 10 mTorr.

12. The method as claimed in claim 4, wherein the color filter layer comprises a plurality of color filters.

13. The method as claimed in claim 12, comprising forming a plurality of micro-lenses on the planarization layer.

14. The method as claimed in claim 13, wherein the plurality of micro-lenses correspond to the plurality of color filters in the color filter layer.

* * * * *